US 8,562,740 B2

(12) United States Patent
Nichol et al.

(10) Patent No.: US 8,562,740 B2
(45) Date of Patent: Oct. 22, 2013

(54) APPARATUS FOR DIRECTIONAL SOLIDIFICATION OF SILICON INCLUDING A REFRACTORY MATERIAL

(75) Inventors: Scott Nichol, Toronto (CA); Dan Smith, Brampton (CA)

(73) Assignee: Silicor Materials Inc., Palo Alto, CA (US)

( * ) Notice: Subject to any disclaimer, the term of this patent is extended or adjusted under 35 U.S.C. 154(b) by 177 days.

(21) Appl. No.: 12/947,936

(22) Filed: Nov. 17, 2010

(65) Prior Publication Data

US 2012/0119407 A1 May 17, 2012

(51) Int. Cl.
*C30B 11/00* (2006.01)

(52) U.S. Cl.
USPC .............. 117/206; 117/11; 117/73; 117/81; 117/83; 117/200; 117/204; 117/223

(58) Field of Classification Search
CPC ............................... C30B 11/00; C30B 11/02
USPC ......... 117/11, 73, 81, 83, 200, 204, 206, 223, 117/931
See application file for complete search history.

(56) References Cited

U.S. PATENT DOCUMENTS

| | | | | |
|---|---|---|---|---|
| 6,136,091 | A | * | 10/2000 | Yamazaki et al. .............. 117/81 |
| 2004/0187767 | A1 | * | 9/2004 | Chandra et al. ................. 117/13 |
| 2007/0227189 | A1 | * | 10/2007 | Sakai ................ 65/83 |
| 2009/0020067 | A1 | * | 1/2009 | Su et al. ............................ 117/3 |
| 2009/0158995 | A1 | * | 6/2009 | Lew .............. 117/200 |

FOREIGN PATENT DOCUMENTS

| | | |
|---|---|---|
| EP | 0887442 | 12/1998 |
| FR | 2509638 | * 1/1983 |
| WO | WO-2009014961 A1 | 1/2009 |
| WO | WO-2010005705 A1 | 1/2010 |

OTHER PUBLICATIONS

"International Application Serial No. PCT/CA2011/050716, International Search Report mailed Jan. 25, 2012", 3 pgs.
"International Application Serial No. PCT/CA2011/050716, Written Opinion mailed Jan. 25, 2012", 5 pgs.

* cited by examiner

*Primary Examiner* — Michael Kornakov
*Assistant Examiner* — Kenneth A Bratland, Jr.
(74) *Attorney, Agent, or Firm* — Schwegman Lundberg & Woessner, P.A.

(57) ABSTRACT

The present invention relates to an apparatus and method for purifying silicon using directional solidification. The apparatus can be used more than once for the directional solidification of silicon without failure. The apparatus and method of the present invention can be used to make silicon crystals for use in solar cells.

16 Claims, 7 Drawing Sheets

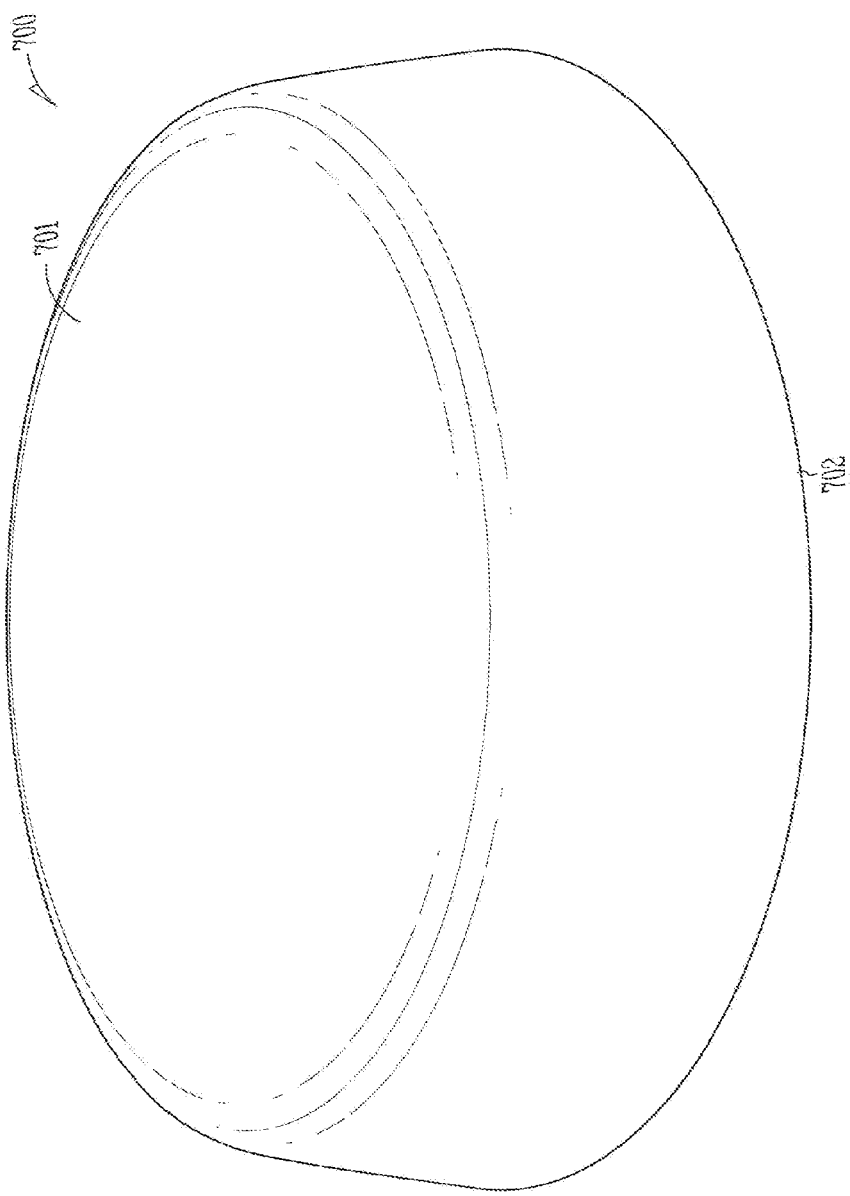

APPARATUS FOR DIRECTIONAL SOLIDIFICATION OF SILICON INCLUDING A REFRACTORY MATERIAL

BACKGROUND

Solar cells can be a viable energy source by utilizing their ability to convert sunlight to electrical energy. Silicon is a semiconductor material used in the manufacture of solar cells; however, a limitation of silicon use relates to the cost of purifying it to solar grade (SG).

Several techniques used to make silicon crystals for solar cells are known. Most of these techniques operate on the principle that while silicon is solidifying from a molten solution, undesirable impurities tend to remain in the molten solution. For example, the float zone technique can be used to make monocrystalline ingots, and uses a moving liquid zone in a solid material, moving impurities to edges of the material. In another example, the Czochralski technique can be used to make monocrystalline ingots, and uses a seed crystal that is slowly pulled out of a solution, allowing the formation of a monocrystalline column of silicon while leaving impurities in the solution. In yet another example, the Bridgeman or heat exchanger techniques can be used to make multicrystalline ingots, and use a temperature gradient to cause directional solidification.

Various techniques for making silicon crystals for solar cells utilize a crucible to hold silicon during the molten manufacturing stage. Unfortunately, most crucibles break after a single use due to, for example, the changing size or shape of the molten silicon as it solidifies. Methods of generating monocrystalline ingots can include the use of a quartz crucible, which is a costly and brittle material. Methods of generating multicrystalline ingots generally use a larger crucible, and due to the expense of quartz, these crucibles are often made of cheaper materials such as fused silica or other refractory materials. Despite being made of cheaper materials, large crucibles made of fused silica or other refractories are still costly to produce, and can generally only be used once. The combination of high expense and limited life of crucibles limits the economic efficiency of silicon purification apparatus and methods.

BRIEF DESCRIPTION OF THE DRAWINGS

In the drawings, which are not necessarily drawn to scale, like numerals describe substantially similar components throughout the several views. Like numerals having different letter suffixes represent different instances of substantially similar components. The drawings illustrate generally, by way of example, but not by way of limitation, various embodiments discussed in the present document.

FIG. 7 illustrates a silicon ingot generated by an apparatus and method of the present invention, as constructed in accordance with at least one embodiment.

SUMMARY

Figure 1:
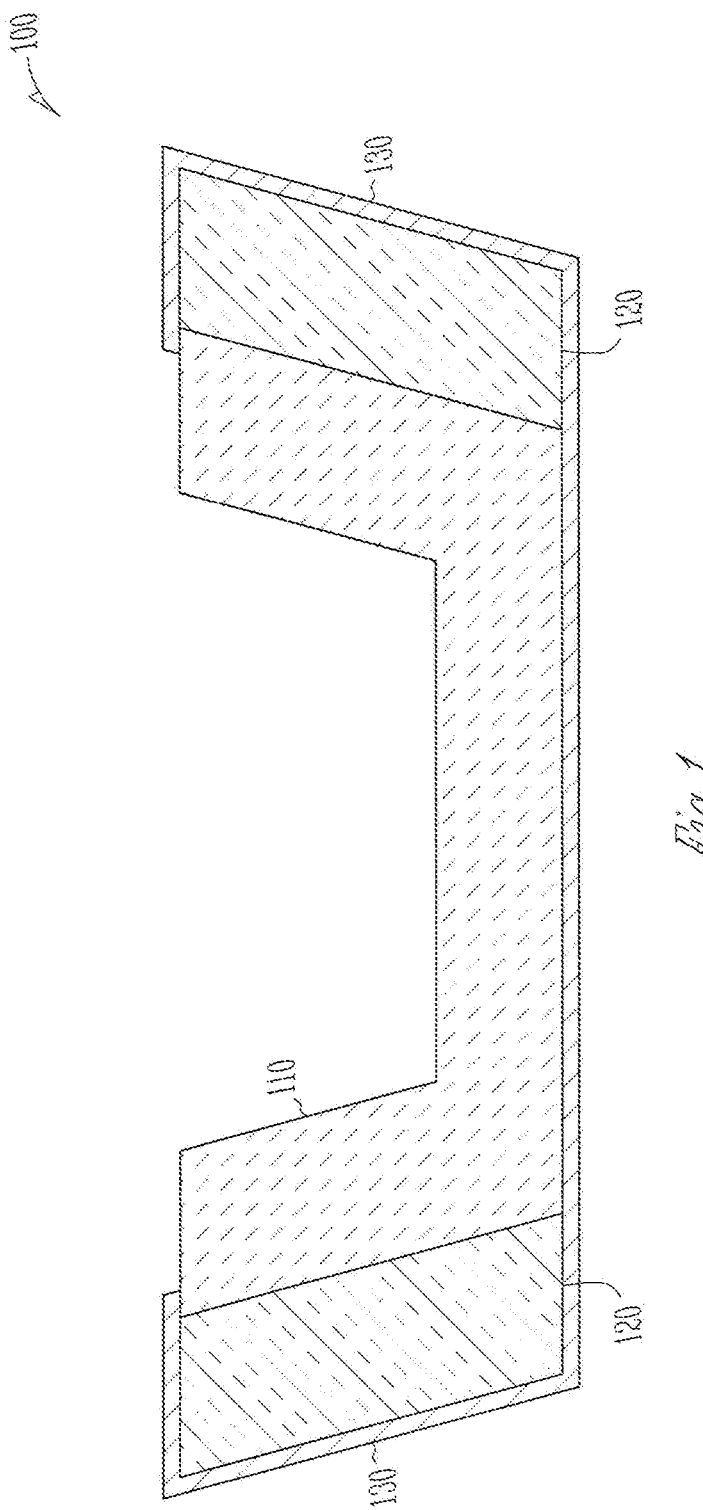
FIG. 1 illustrates a cross-sectional view of a mold, an outer jacket and an insulating layer of an apparatus for directional solidification of silicon, as constructed in accordance with at least one embodiment.

In view of current energy demands and supply limitations, the present inventors have recognized a need for a more cost efficient way of purifying metallurgical grade (MG) silicone (or any other silicon having a greater amount of impurities than solar grade) to solar grade silicon.

The present invention relates to an apparatus for directional solidification of silicon. The invention provides, among other things, a directional solidification mold. The directional solidification mold can include at least one refractory material. The at least one refractory material can be configured to allow directional solidification of silicon within the mold. An outer jacket and an insulating layer can surround portions of the mold. In various examples, the insulating layer is disposed at least partially between the directional solidification mold and the outer jacket. The present inventors have found that such a mold configuration can be repeatedly used for the directional solidification of silicon without failure.

In some examples, one or more side walls of the directional solidification mold can include aluminum oxide. In some examples, a bottom of the directional solidification mold can include silicon carbide. The directional solidification mold can also include a top layer. The top layer can include a slip-plane refractory. The top layer can be configured to sufficiently protect portions of the directional solidification mold from damage when a directionally solidified silicon product is removed. In some examples, the outer jacket of the mold can include steel or stainless steel. In some examples, the insulating layer can include an insulating brick, a refractory material, a mixture of refractory materials, an insulating board, a ceramic paper, a high temperature wool, or combinations thereof.

In some examples, the invention also includes a heater. The heater can include one or more heating members. The one or more heating members can independently include either a heating element or an induction heater. A heating member that includes a heating element can utilize materials such as silicon carbide, molybdenum disilicide, graphite, or combinations thereof. The heater can also include an insulating brick, a refractory, a mixture of refractories, an insulating board, a ceramic paper, a high temperature wool, or combinations thereof. An outer jacket or insulation can surround portions of the heater. The outer jacket of the heater can include steel or stainless steel. The insulation of the heater can be at least partially disposed between the one or more heating members and the outer jacket.

The present invention also relates to a method of purifying silicon. The method of purifying silicon can be a method for making one or more ingots for manufacture into solar cells. The method of purifying silicon can be a method of making one or more silicon ingots for cutting into one or more solar wafers. The method can include providing or receiving a first silicon and at least partially melting the first silicon. The method can include providing or receiving a directional solidification apparatus. The silicon can be at least partially melted to provide a first molten silicon. The method can further include directionally solidifying the first molten silicon. The first silicon can be directionally solidified using the directional solidification apparatus. The directional solidification of the first molten silicon in the directional solidification apparatus can provide a second silicon. The apparatus for directional silicon can include a directional solidification mold. The directional solidification mold can include at least one refractory material. The directional solidification of the silicon can occur in the directional solidification mold of the directional solidification apparatus. The refractory material can be configured to allow the directional solidification of silicon within the mold. An outer jacket and an insulating layer can surround portions of the mold. The insulating layer is disposed at least partially between the directional solidification mold and the outer jacket. Also, the apparatus can be repeatedly used for the directional solidification of silicon without failure.

In one specific embodiment, the present invention also relates to an apparatus for the purification of silicon. The apparatus includes a directional solidification mold. The directional solidification mold includes at least one refractory material. The at least one refractory material is configured to allow the directional solidification of silicon within the mold. One or more sides of the directional solidification mold include aluminum oxide. A bottom of the directional solidification mold includes silicon carbide or graphite. The directional solidification mold also includes a top layer. The top layer includes a slip-plane refractory. The top layer is configured to protect the remainder of the directional solidification mold from damage when directionally solidified silicon is removed from the mold. The invention also includes an outer jacket. The outer jacket includes steel or stainless steel. The invention also includes an insulating layer. The insulating layer is disposed at least partially between one or more sides of the directional solidification mold and one or more sides of the outer jacket. The insulating layer includes insulating brick, a refractory material, a mixture of refractory materials, insulating board, ceramic paper, high temperature wool, or a combination thereof. The specific embodiment also includes a top heater. The top heater includes one or more heating members. The one or more heating members independently include either a heating element or an induction heater. The heating element includes silicon carbide, molybdenum disilicide, graphite, or a combination thereof. The top heater also includes insulating brick, a refractory, a mixture of refractories, insulating board, ceramic paper, high temperature wool, or a combination thereof. The top heater also includes an outer jacket. The outer jacket of the top heater includes steel or stainless steel. The insulation of the top heater is at least partially disposed between the one or more heating members and the top heater outer jacket. Also, the directional solidification mold, the outer jacket, and the insulating layer are configured to be used more than twice for the directional solidification of silicon.

The present invention provides advantages over previous apparatus and methods for directional solidification of silicon. In one example, the present invention can provide an economically more efficient method of purifying silicon due to reusability of the apparatus. For example, the present invention can provide an economically more efficient method of making one or more silicon ingots for cutting into one or more solar wafers. The reusability of the apparatus can help to reduce waste, and can provide a more economical way to use larger crucibles for directional solidification. By allowing the efficient use of larger crucibles, the present invention can enable directional solidification methods that benefit from the economics of scaling. Additionally, the heater present in some embodiments of the present invention offers a convenient and efficient way to heat the silicon, maintain the temperature of the silicon, control the cooling of the silicon, or a combination thereof, which can allow precise control over the temperature gradient and the corresponding directional solidification of the silicon. The apparatus and method of the present invention can be used to make silicon crystals for use in solar cells, among other things.

DETAILED DESCRIPTION

Reference will now be made in detail to certain examples of the disclosed subject matter, some of which are illustrated in the accompanying drawings. While the disclosed subject matter will largely be described in conjunction with the accompanying drawings, it should be understood that such descriptions are not intended to limit the disclosed subject matter to those drawings. On the contrary, the disclosed subject matter is intended to cover all alternatives, modifications, and equivalents, which can be included within the scope of the presently disclosed subject matter, as defined by the claims.

References in the specification to "one embodiment", "an embodiment", "an example embodiment", etc., indicate that the embodiment described can include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

In this document, the terms "a" or "an" are used to include one or more than one and the term "or" is used to refer to a nonexclusive "or" unless otherwise indicated. In addition, it is to be understood that the phraseology or terminology employed herein, and not otherwise defined, is for the purpose of description only and not of limitation. Furthermore, all publications, patents, and patent documents referred to in this document are incorporated by reference herein in their entirety, as though individually incorporated by reference. In the event of inconsistent usages between this document and those documents so incorporated by reference, the usage in the incorporated reference should be considered supplementary to that of this document; for irreconcilable inconsistencies, the usage in this document controls.

In the methods of manufacturing described herein, the steps can be carried out in any order without departing from the principles of the invention, except when a temporal or operational sequence is explicitly recited. Recitation in a claim to the effect that first a step is performed, then several other steps are subsequently performed, shall be taken to mean that the first step is performed before any of the other steps, but the other steps can be performed in any suitable sequence, unless a sequence is further recited within the other steps. For example, claim elements that recite "Step A, Step B, Step C, Step D, and Step E" shall be construed to mean step A is carried out first, step E is carried out last, and steps B, C, and D can be carried out in any sequence between steps A and E, and that the sequence still falls within the literal scope of the claimed process. A given step or sub-set of steps can also be repeated.

Furthermore, specified steps can be carried out concurrently unless explicit claim language recites that they be carried out separately. For example, a claimed step of doing X and a claimed step of doing Y can be conducted simultaneously within a single operation, and the resulting process will fall within the literal scope of the claimed process.

The present invention relates to an apparatus and method for purifying silicon using directional solidification. The apparatus can advantageously be used more than once for the directional solidification of silicon. The apparatus and method of the present invention can be used to make silicon crystals for use in solar cells.

By controlling the temperature gradient in embodiments of the present invention, a highly controlled directional solidification can be accomplished. In the present invention, the directional crystallization proceeds approximately from bottom to top, thus the desired temperature gradient has a lower temperature at the bottom and a higher temperature at the top. High degrees of control over the temperature gradient and the corresponding directional crystallization can advantageously allow a more effective directional solidification, resulting in a silicon of higher purity.

DEFINITIONS

As used herein, "conduit" refers to tube-shaped hole through a material, where the material is not necessarily tube-shaped. For example, a hole running through a block of material is a conduit. The hole can be of greater length than diameter. A conduit can be formed by encasing a tube (including a pipe) in a material.

As used herein, "directional solidification" refers to crystallizing a material starting in approximately one location, proceeding in an approximately linear direction (e.g. vertically, horizontally, or perpendicular to a surface), and ending in approximately another location. As used in this definition, a location can be a point, a plane, or a curved plane, including a ring or bowl shape.

As used herein, "fan" refers to any device or apparatus which can move air.

As used herein, "heating element" refers to a piece of material which generates heat when electricity is allowed to flow through that material.

As used herein, "induction heater" refers to a heater which adds heat to a material via the inducement of electrical currents in that material. Generally, such electrical currents are generated by allowing an alternating current to travel through a coil of metal that is proximate to the material to be heated.

As used herein, "melt" refers to undergoing the phase transition from solid to liquid.

As used herein, "oil" refers to a substance that is liquid at ambient temperature, that is hydrophobic, and that has a boiling point above 300° C. Examples of oils include but are not limited to vegetable oils and petroleum oils.

As used herein, "refractory material" refers to a material which is chemically and physically stable at high temperatures. Examples of refractory materials include but are not limited to aluminum oxide, silicon oxide, magnesium oxide, calcium oxide, zirconium oxide, chromium oxide, silicon carbide, graphite, or a combination thereof.

As used herein, "hot face refractory" refers to a refractory material.

As used herein, "conducting refractory" refers to a refractory material that can conduct heat.

As used herein, "side" or "sides" can refer to one or more sides, and unless otherwise indicated refers to the side or sides or an object as contrasted with one or more tops or bottoms of the object.

As used herein, "silicon" refers to the element Si, and can refer to Si in any degree of purity, but generally refers to silicon that is at least 50% by weight pure, preferably 75% by weight pure, more preferably 85% pure, more preferably 90% by weight pure, and more preferably 95% by weight pure, and even more preferably 99% by weight pure.

As used herein, "slip-plane refractory" refers to a refractory material that decreases friction and decreases sticking between the solid silicon and the directional solidification mold.

As used herein, "tube" refers to a hollow pipe-shaped material. A tube generally has an internal shape that approximately matches its outer shape. The internal shape of a tube can be any suitable shape, including round, square, or a shape with any number of sides, including non-symmetrical shapes.

Bottom Mold

FIG. 1 illustrates an embodiment of the present invention. A side-view cut-away of the apparatus 100 is shown. Apparatus 100 includes a directional solidification mold 110, which includes at least one refractory material. The at least one refractory material is configured to allow directional solidification of silicon within the mold. The apparatus 100 also includes an outer jacket 130. Additionally, the apparatus 100 includes an insulating layer 120, disposed at least partially between the directional solidification mold 110 and the outer jacket 130. The apparatus 100 can be used more than once for the directional solidification of silicon.

The overall three-dimensional shape of an embodiment of the invention can be similar to a thick-walled large bowl, having a circular shape. Alternatively, the overall shape can be similar to a large bowl, having a square shape, or a hexagon, octagon, pentagon, or any suitable shape, with any suitable number of edges. In other embodiments, the overall shape of the apparatus can be any suitable shape for directional solidification of silicon. In one embodiment, the bottom mold can hold about 1 metric tonne of silicon, or more. In one embodiment, the bottom mold can hold about 1.4 metric tonnes of silicon, or more. In another embodiment, the bottom mold can hold about 2.1 metric tonnes of silicon, or more. In another embodiment, the bottom mold can hold approximately 1.2, 1.6, 1.8, 2.0, 2.5, 3, 3.5, 4, 4.5, or 5 metric tonnes of silicon, or more.

In preferred embodiments of the present invention, the apparatus is approximately symmetrical about a center vertical axis. An embodiment in which the materials included in the apparatus or the shape of the apparatus deviate from close symmetry about a center axis is still included as a preferred embodiment; the preference for symmetry is approximate, as will readily be understood by one of skill in the art. In some embodiments, the apparatus is not symmetrical about a center vertical axis. In other embodiments, the apparatus is partially approximately symmetrical about a center vertical axis and partially non-symmetrical about a center vertical axis. In embodiments that include non-symmetric features, any suitable feature can be included that is described herein, including features described as being part of an embodiment that is approximately symmetric about a center axis in whole or in part.

As shown in FIG. 1, the directional solidification mold 110 has a greater than 90 degree internal angle between the bottom of the directional solidification mold and the sides of the directional solidification mold, referred to as a draft herein. The draft allows a piece of silicon solidified in the mold to be removed without having to break the silicon or the directional solidification mold. In a preferred embodiment, the directional solidification mold has a draft, as shown in FIG. 1, sufficient to allow the removal of silicon from the mold as described. However, in alternative embodiments, the directional solidification has no draft, or has the reverse of a draft.

In alternative embodiments with no draft, the apparatus preferably will have a cut through the middle that allows it to be easily parted into two halves for removal of the solid silicon. The two halves can then be rejoined to again form a whole, and the apparatus reused. However, embodiments that can be broken into two halves are not restricted to those embodiments that lack draft. All embodiments discussed herein can either include or not include the ability to be separated into halves for easy removal of the solid silicon.

The directional solidification mold 110 shown in FIG. 1 includes a refractory material. The refractory material can be any suitable refractory material. The refractory material can be aluminum oxide, silicon oxide, magnesium oxide, calcium oxide, zirconium oxide, chromium oxide, silicon carbide, graphite, or a combination thereof. The directional solidification mold can include one refractory material. The directional solidification mold can include more than one refractory material. The refractory material or materials that are included in the directional solidification mold can be mixed, or they can be located in separate parts of the directional solidification mold, or a combination thereof. The one or more refractory materials can be arranged in layers. The directional solidification mold can include more than one layer of one or more refractory materials. The directional solidification mold can include one layer of one or more refractory materials. The sides of the refractory can be a different material than the bottom of the refractory. The sides of the directional solidification mold as compared to the bottom of the directional solidification mold can be different thicknesses, include different compositions of material, include different amounts of material, or a combination thereof. In one embodiment, the sides of the directional solidification mold include a hot face refractory, and the bottom of the directional solidification mold includes a conducting refractory. The sides of the directional solidification mold can include aluminum oxide. The bottom of the directional solidification mold can include a heat-conductive material, such as, for example, silicon carbide, graphite, steel, stainless steel, cast iron, copper, or a combination thereof.

In some embodiments, the material or materials that are included in the sides of the directional solidification mold can extend from a height of the external-bottom of the directional solidification mold and upwards, and the material or materials that are included in the bottom of the directional solidification mold can extend vertically from a vertical position corresponding to the inside of one side of the directional solidification mold across the bottom to the a vertical position corresponding to the inside of the opposite side. In another embodiment, the material or materials that are included in the sides of the directional solidification mold can extend from a height of the internal-bottom of the directional solidification mold and upwards, while the material or materials that are included in the bottom of the directional solidification mold can extend vertically from a vertical position corresponding to the outside of one side of the directional solidification mold across the bottom of the directional solidification mold to a vertical position corresponding to the outside of the opposite side of the directional solidification mold. In another example, the material or materials that are included in the sides of the directional solidification mold can extend from a height above the height of the bottom of the directional solidification mold and upwards, while the material or materials that are included in the bottom of the directional solidification mold can extend vertically across the bottom of the directional solidification mold from a vertical position corresponding to one external side of the directional solidification mold to a vertical position corresponding to the other external side of the directional solidification mold, and also extend up the sides above the height of the bottom of the directional solidification mold. In another example, the material or materials that are included in the sides of the directional solidification mold can extend from a height of the internal-bottom of the directional solidification mold and upwards, while the material or material or materials that are included in the bottom of the directional solidification mold can extend vertically from the inner side of a side of the outer jacket across the inner-bottom of the outer jacket to the inner side of the opposite side of the outer jacket, or the material or material or materials that are included in the bottom of the directional solidification mold can extend vertically from in-between the inner side of a side of the outer jacket and the vertical position corresponding to the outer side of the directional solidification mold, across the bottom of the directional solidification mold, to in-between the opposite inner side of the outer jacket and the vertical position corresponding to the outer side of the opposite side of the directional solidification mold.

The insulating layer 120 of apparatus 100 shown in FIG. 1 can include an insulating material. The insulating material can be any suitable material. For example, the insulating material can be insulating brick, a refractory material, a mixture of refractory materials, insulating board, ceramic paper, high temperature wool, or a combination thereof. Insulating board can include high temperature ceramic board. The insulating layer can include more than one insulating material. The insulating material or materials that are included in the insulating layer 120 can be blended, mixed, or they can be located in separate parts of the insulating layer, or a combination thereof. The one or more insulating materials can be arranged in layers. In one example, the insulating layer can include more than one layer of one or more insulating materials. In another example, the insulating layer can include one layer of one or more insulating materials. The sides of the insulating layer can be a different material than the bottom of the insulating layer. For example, the sides of the insulating layer as compared to the bottom of the insulating layer can be different thicknesses, include different compositions of material, or a combination thereof. In one embodiment, the insulating layer is disposed between the bottom of the directional solidification mold and the outer jacket. In a preferred embodiment, the insulating layer is disposed at least partially between the sides of the directional solidification mold and the sides of the outer jacket, and the insulating layer is not disposed between the bottom of the directional solidification mold and the bottom of the outer jacket, as depicted in FIG. 1.

The insulating layer 120 of apparatus 100 is shown in FIG. 1 disposed between the sides of the outer jacket of the apparatus and the sides of the directional solidification mold of the apparatus. As shown, the sides of the insulating layer extend from a height corresponding to the inner side of the bottom of the outer jacket and upwards. Embodiments of the present invention also can include configurations of the insulating layer 120 in which the insulating layer extends from a height corresponding to the bottom of the inside of the directional solidification mold and upwards. In another example, the insulating layer extends from in-between the inner side of the bottom of the outer jacket and the height of the inner side of the bottom of the outer jacket and upwards. In another embodiment, the insulating layer extends from above the height corresponding to the bottom of the inside of the directional solidification mold and upwards.

The outer jacket 130 of apparatus 100 shown in FIG. 1 can include any suitable material to enclose the insulating layer and the directional solidification mold. The outer jacket can include one or more materials. In one embodiment, the outer jacket includes steel. In another embodiment, the outer jacket includes steel, stainless steel, copper, cast iron, a refractory material, a mixture of refractory materials, or a combination thereof. Different portions of the outer jacket can include different materials, different thicknesses of materials, different compositions of materials, or a combination thereof.

In some embodiments, the outer jacket can include structural members. The structural members can add strength and rigidity to the apparatus and can include any suitable material. For example, the structural members can include steel, stainless steel, copper, cast iron, a refractory material, a mixture of refractory materials, or a combination thereof. In one example, the outer jacket can include one or more structural members that extend from the outside of the outer jacket in a direction that is away from the center of the apparatus, and that extend horizontally around the circumference or perimeter of the apparatus. The one or more horizontal structural members can be located, for example, at the upper edge of the outside of the outer jacket, at the bottom edge of the outside of the outer jacket, at any position in-between the top and bottom edges of the outside of the outer jacket. In one example, the apparatus includes three horizontal structural members, with one located at the upper edge of the outer jacket, one located at the bottom edge of the outer jacket, and one located in-between the upper and lower edges of the outer jacket. The outer jacket can include one or more structural members on the outside of the outer jacket that extend from the outside of the of the outer jacket in a direction that is away from the center of the apparatus, and that extend vertically from the bottom of the outside of the outer jacket to the top of the outside of the outer jacket. In one example, the outer jacket can include eight vertical structural members. The vertical structural members can be evenly spaced around the circumference or perimeter of the outer jacket. In another example, the outer jacket includes both vertical and horizontal structural members. The outer jacket can include structural members that extend across the bottom of the outer jacket. The structural member on the bottom can extend from one outer edge of the bottom of the outer jacket to another edge of the bottom of the outer jacket. A structural members on the bottom can also extend partially across the bottom of the outer jacket. Structural members can be strips, bars, tubes, or any suitable structure for adding structural support to the apparatus. A structural member can be attached to the outer jacket via welding, brazing, or any other suitable method. The structural members can be adapted to facilitate transportation and physical manipulation of the apparatus. For example, the structural members on the bottom of the outside of the outer jacket can be tubes of sufficient size, strength, orientation, spacing, or a combination thereof, such that a particular forklift or other lifting machine could lift or move or otherwise physically manipulate the apparatus. In another embodiment, the structural members described above as being located on the outside of the outer jacket can alternatively or additionally be located on the inside of the outer jacket.

The outer jacket 130 is shown in FIG. 1 as extending over the top of the insulating layer 120 and partially covering the top of the directional solidification mold 110. However, embodiments of the present invention also encompass a wide range of various structural configurations of the outer jacket 130 with respect to the insulating layer 120 and the directional solidification mold 110. Embodiments can include an outer jacket 130 extending completely to the inner rim of the top of the directional solidification mold 110, the outer jacket 130 extending only part way across the top of the insulating layer 120, or the outer jacket 130 not extending across any part of the insulating layer 120. Also included are configurations in which the outer jacket 130 does not extend fully up the side of the outside of the insulating layer. In an embodiment in which the outer jacket extends over any portion of the top of the directional solidification mold or the insulating layer, the portion of the outer jacket that extends over the top can include a material with greater insulating properties than the sides and bottom of the outer jacket. In some embodiments, such a choice of material can encourage formation of a desired temperature gradient in the apparatus.

The top edge of the apparatus 100 shown in FIG. 1 is depicted with the directional solidification mold 110 and the insulating layer 120 at an approximately even height, and with the top of the outer jacket extending over the top of the insulating layer and partially over the top of the directional solidification layer. As discussed above, other configurations of the top of the outer jacket, the top of the insulating layer, and the top of the directional solidification mold are encompassed as embodiments of the present invention, including all suitable arrangements. For example, the insulating layer can extend vertically to a height above the top edge of the directional solidification mold. Alternatively, the directional solidification mold can extend vertically to a height above the top edge of the directional solidification mold. The insulating layer can extend partially or completely over the top edge of the directional solidification mold. Or, the directional solidification mold can extend partially or completely over the top edge of the insulating layer.

The apparatus 100 shown in FIG. 1 is depicted with particular relative thicknesses of the directional solidification mold 110, the insulating layer 120, and the outer jacket 130. However, embodiments of the present invention encompass any suitable relative thickness of the mold 110, insulation 120, and outer jacket 130.

The apparatus 100 in FIG. 1 can be used more than once to directionally solidify silicon. In being able to be used more than once, the apparatus can be reused for directional solidification with no repairs between uses, or with minimal repairs between uses. Minimal repairs can include touching up or reapplying entirely a coating that is part of the inner side of the directional solidification mold, for example repairing a top layer, including a slip-plane refractory coating. Embodiments of the present invention also include an apparatus that can be used more than twice for directional solidification of silicon. Also included are apparatus that can be used more than three, four, five, six, twelve, or more times, for the directional solidification of silicon.

In some embodiments of the present invention the apparatus only includes a bottom mold. In other embodiments, the present invention includes both a bottom mold and a top heater.

Figure 2:
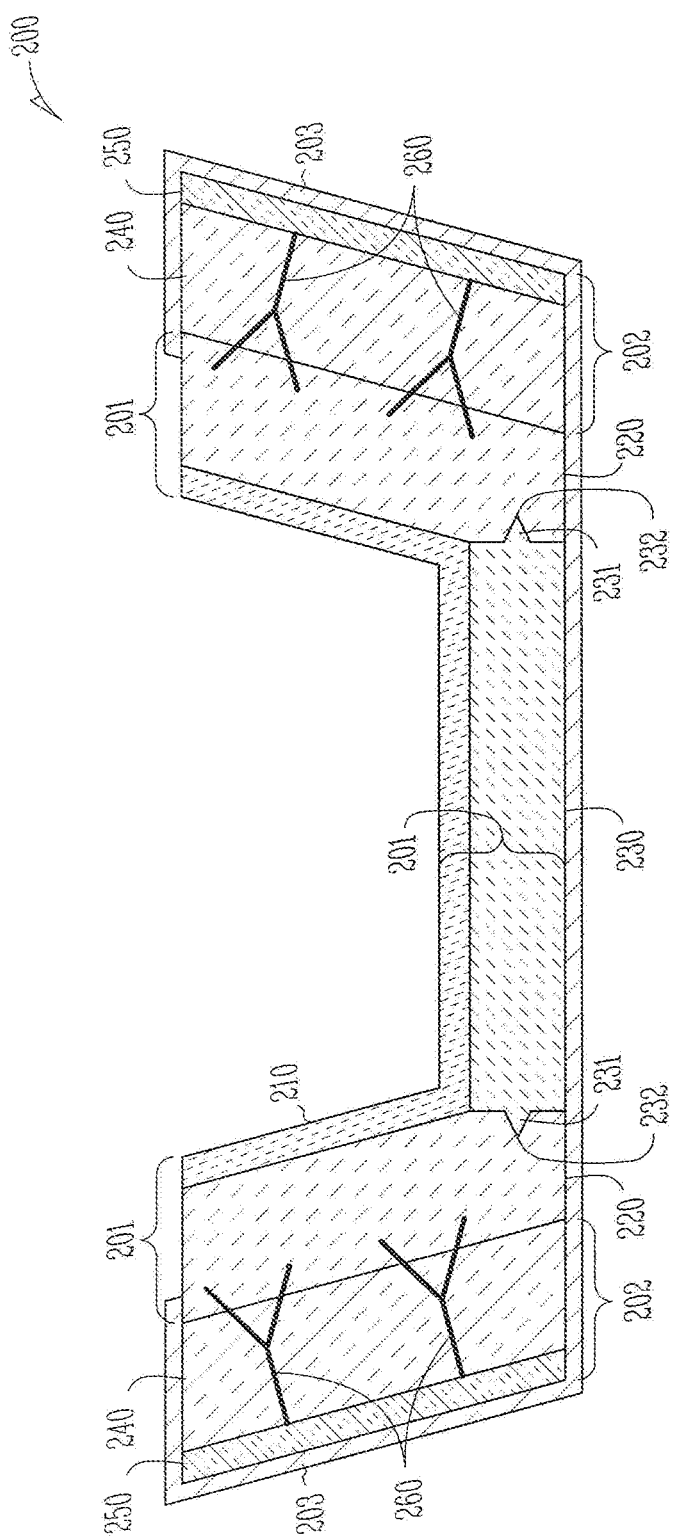
FIG. 2 illustrates a cross-sectional view of a mold, an outer jacket and an insulating layer of an apparatus for directional solidification of silicon, as constructed in accordance with at least one embodiment.

FIG. 2 illustrates an embodiment of the present invention. A side-view cut-away of the apparatus 200 is shown. Apparatus 200 includes a directional solidification mold 201, which includes at least one refractory material. The at least one refractory material is configured to allow directional solidification of silicon within the mold. The apparatus 200 also includes an outer jacket 203. Additionally, the apparatus includes an insulating layer 202, disposed at least partially between the directional solidification mold 201 and the outer jacket 203. The apparatus 200 can be used more than once for the directional solidification of silicon.

The directional solidification mold 201 shown in FIG. 2 includes one or more refractory materials. The sides of the directional solidification mold include a hot face refractory 220. In FIG. 2, the hot face refractory 220 of the directional solidification mold extends from the inside of the bottom of the outer jacket and upwards; as discussed above, various configurations of the sides of the directional solidification mold are encompassed as embodiments of the present invention. The hot face refractory 220 can be any suitable refractory material. For example, the hot face refractory 220 can be aluminum oxide.

In building the bottom mold apparatus of the present invention, refractory materials can be applied in a manner similar to applying wet cement. A trawl or other suitable implement, including forms, can be used to manipulate the wet refractory into the desired shape, followed by allowing the refractory material to dry and set.

The bottom of the directional solidification mold 201 shown in FIG. 2 includes a conducting refractory 230. In FIG. 2, the conducting refractory 230 of the directional solidification mold extends vertically in-between a vertical position corresponding to the outside of a side of the directional solidification mold and a vertical position corresponding to the inside of a side of the directional solidification mold, across the bottom of the directional solidification mold, to in-between the a vertical position corresponding to the outside of the opposite side of the directional solidification mold and a vertical position corresponding to the outside of the opposite side of the directional solidification mold; as discussed above, various configurations of the sides of the directional solidification mold are encompassed as embodiments of the present invention. The conducting refractory 230 can be any suitable material. For example, the conducting refractory can contain silicon carbide. By placing a conducting material on the bottom of the apparatus, cooling of the bottom of molten silicon that is within the directional solidification mold is facilitated. Facile cooling of the bottom of the mold assists in forming and controlling a temperature gradient between the bottom and the top of the directional solidification mold, allowing the desired directional solidification to take place within the mold beginning at the bottom and ending at the top.

In an alternative embodiment, the bottom of the directional solidification mold can include any suitable heat-conducting material for element 230, including silicon carbide, graphite, copper, steel, stainless steel, graphite, cast iron, or a combination thereof. As with the embodiment shown in FIG. 2, such an embodiment can include a top layer 210. Alternatively, such an embodiment does not include a top layer 210.

Conducting refractory 230 is shown in FIG. 2 with an appendage member 231 at its outer edge. The appendage member 231 of the conducting refractory 230 secures the conducting refractory into a receiving slot 232 located in the hot face refractory 220. Securing the hot face refractory to the conducting refractory prevents it from coming loose from the apparatus. In one embodiment, the appendage 231 and the receiving slot 232 are included. In another embodiment, they are not included. In other embodiments, alternative means of securing the conducting refractory are included.

The directional solidification mold 201 shown in FIG. 2 also includes a top layer 210. The top layer includes at least one slip-plane refractory material. The slip-plane refractory material can include any suitable refractory material. The slip-plane refractory material includes fused silicon dioxide, silicon dioxide, aluminum oxide, silicon nitride, graphite, or a combination thereof. The top layer 210 is such that it protects the remainder of the directional solidification mold from damage when directionally solidified silicon is removed from the mold. For example, the remainder of the directional solidification mold 201 in FIG. 2 is the hot face refractory 220 and the conducting refractory 230. The top layer 210 can be of approximately consistent thickness and composition throughout, as shown in FIG. 2. In other embodiments, the top layer can have variable thickness or composition. Alternatively, some portions of the top layer can be of approximately consistent thickness and composition, and other portions of the top layer can have variable thickness or composition. In protecting the remainder of the directional solidification mold from damage when the solid silicon is removed, and in facilitating the removal of the solid silicon, the top layer can become damaged in part or in full when the silicon is removed. The top layer can be replaced or repaired in-between one or more uses of the apparatus. The top layer can be applied in any suitable manner. The top layer can be applied as a spray, or brushed on. In another example the top layer can be applied using a trawl, and spread like wet cement. After application, the top layer can be allowed to dry and set. In some embodiments, colloidal silica can be used as a binder for the top layer, including for the slip plane refractory spray. The top layer can be heated before it is used to dry it out and prepare it for use.

The insulating layer 202 of apparatus 200 shown in FIG. 2 is disposed at least partially between the sides of the directional solidification mold 201 and the outer jacket 203. As shown in FIG. 2, the insulating layer of a specific embodiment extends from the inside of the bottom of the outer jacket and upwards. As discussed above, various configurations of the insulating layer are encompassed as embodiments of the present invention. The insulating layer 202 shown in FIG. 2 includes two layers, inner layer 240 and outer layer 250. The layers 240 and 250 can include any suitable insulating material. In one embodiment, outer insulating layer 250 includes ceramic paper and high temperature ceramic board. In one embodiment, outer insulating layer 250 includes ceramic paper, high temperature wool, high temperature ceramic board, or a combination thereof. In one embodiment, inner insulating layer 240 includes insulating brick or a refractory material, where the refractory material can include a castable refractory material.

The outer jacket 203 of apparatus 200 shown in FIG. 2 includes any suitable material. For example, outer jacket 203 includes steel or stainless steel. In FIG. 2, the outer jacket is shown extending over the top of the outer layer 250 and partially over the top of the inner layer 240; as discussed above, various configurations of the insulating layer are encompassed as embodiments of the present invention.

The apparatus 200 shown in FIG. 2 includes anchors 260. The anchors can secure the refractory layers in the apparatus, to prevent them from loosening. For example, in FIG. 2, the anchors 260 secure the hot face refractory 220 to the inner layer 240, and can help to secure the apparatus. In other embodiments, the anchors can be fixed in the outer jacket and can extend through any number of layers to secure them. In other embodiments, the anchors can start and end in any suitable layers. The anchors can include any suitable material. For example, the anchors can include steel, stainless steel, or cast iron. The anchors can be any suitable shape, and in any suitable orientation. By securing the apparatus with anchors 260, with the appendage 231 and slot 232, with a combination thereof, or with an alternative means of securing, the apparatus can have a longer lifetime and can withstand more varied treatments with minimized damage. Additionally, securing the apparatus with anchors 260, with the appendage 231 and slot 232, with a combination thereof, or with alternative securing means, can help to prevent the layers from falling out of the apparatus if the apparatus is inverted.

Top Heater

In one embodiment, the present invention also includes a top heater. The top heater can be positioned on top of the bottom mold. The shape of the bottom of the top heater approximately matches the shape of the top of the bottom mold. The top heater can apply heat to the top of the bottom mold, heating the silicon therein. Application of heat to the bottom mold can cause melting of silicon in the bottom mold. Additionally, application of heat to the bottom mold can allow control of the temperature of the silicon in the bottom mold. Also, the top heater can be positioned on top of the bottom mold without heating, serving as an insulator to control the release of heat from the top of the bottom mold. By controlling the temperature or release of heat of the top of the bottom mold, the desired temperature gradient can be more easily accomplished, which can allow a more highly controlled directional solidification. Ultimately, control over the temperature gradient can allow a more effective directional solidification in which the resulting purity of the silicon is maximized. In one embodiment, type B thermocouples can be used to monitor the temperature inside the furnace chamber.

Figure 3:
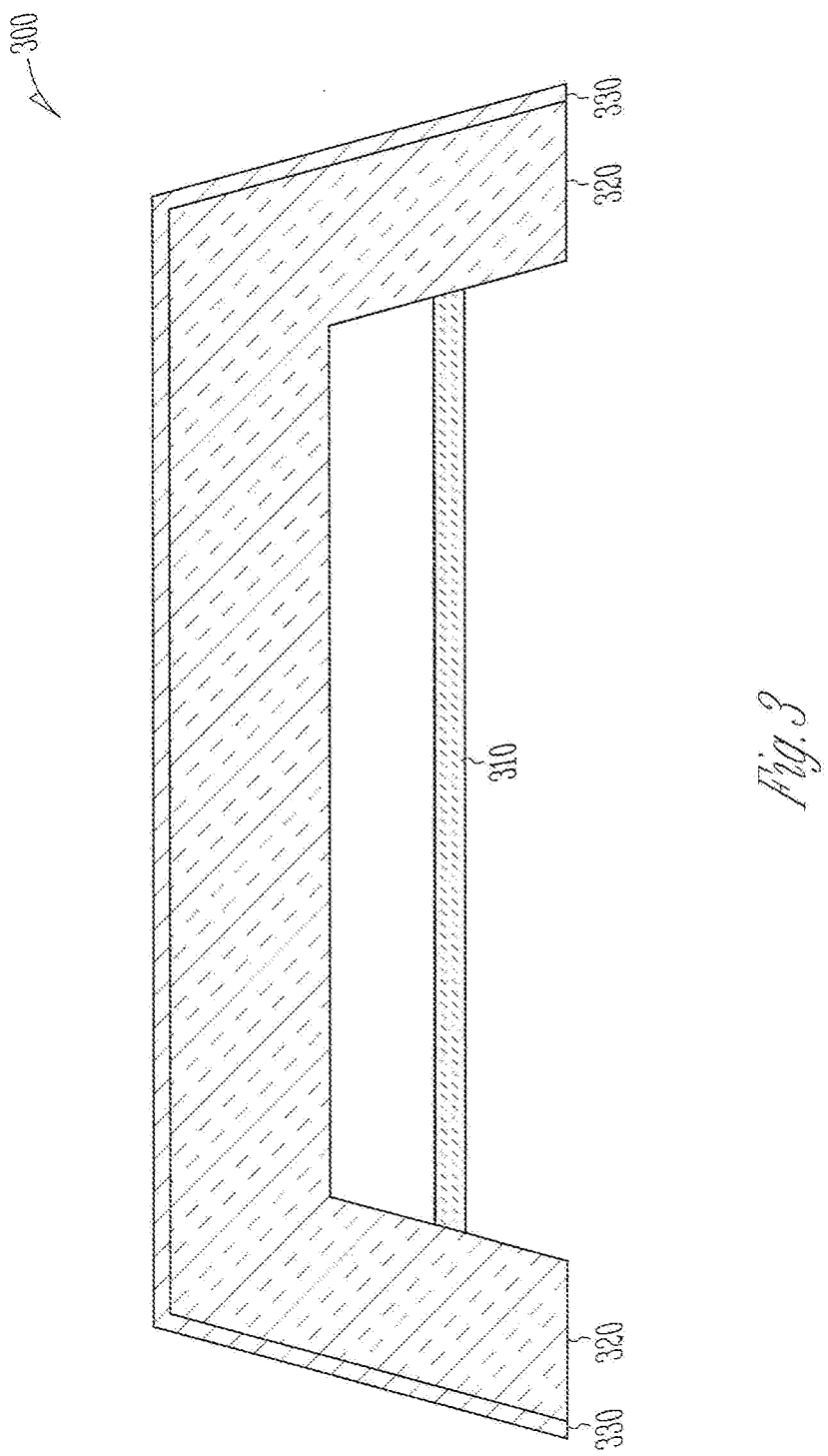
FIG. 3 illustrates a cross-sectional view of a heater of an apparatus for directional solidification of silicon, as constructed in accordance with at least one embodiment.

FIG. 3 illustrates a top heater 300. The top heater can include one or more heating members 310. Each of the one or more heating members can independently include any suitable material. For example, each of the one or more heating members independently can include a heating element, where the heating element can include silicon carbide, molybdenum disilicide, graphite, or a combination thereof; and, each of the one or more heating members can alternatively independently include an induction heater. In one embodiment, the one or more heating members are positioned at approximately the same height. In another embodiment, the one or more heating members are positioned at different heights.

In one example, the heating elements include silicon carbide, which has certain advantages. For example, silicon carbide heating elements do not corrode at high temperatures in the presence of oxygen. Oxygen corrosion can be reduced for heating elements including corrodible materials by using a vacuum chamber, but silicon carbide heating elements can avoid corrosion without a vacuum chamber. Additionally, silicon carbide heating elements can be used without water-cooled leads. In one embodiment, the heating elements are used in a vacuum chamber, with water-cooled leads, or both. In another embodiment, the heating elements are used without a vacuum chamber, without water-cooled leads, or without both.

In one embodiment, the one or more heating members are induction heaters. The induction heaters can be cast into one or more refractory materials. The refractory material containing the induction heating coil or coils can then be positioned over the bottom mold. The refractory material can be any suitable material. For example, the refractory material can include aluminum oxide, silicon oxide, magnesium oxide, calcium oxide, zirconium oxide, chromium oxide, silicon carbide, graphite, or a combination thereof. In another embodiment, the induction heaters are not cast into one or more refractory materials.

In one embodiment the one or more heating members have an electrical system such that if at least one heating member fails, any remaining functional heating members continue to receive electricity and to produce heat. In one embodiment, each heating member has its own circuit.

The top heater can include insulation, for example top heater 300 shown in FIG. 3 includes insulation 320. The insulation can include any suitable insulating material. The insulation can include one or more insulating materials. For example, the insulation can include insulating brick, a refractory, a mixture of refractories, insulating board, ceramic paper, high temperature wool, or a mixture thereof. Insulating board can include high temperature ceramic board. As shown in FIG. 3, the bottom edge of the insulating material and the one or more heating members 310 are at approximately the same height. Other configurations of the one or more heating members and the insulation are encompassed as embodiments of the present invention. For example, the one or more heating members can include an induction heater, the insulation can include a refractory material, and the one or more heating members can be encased in the refractory material. In such an embodiment, additional insulating material can also be optionally included, where the additional insulation can be refractory material, or the additional insulation can be another suitable insulating material. In another example, the one or more heating members can include an induction heater, and the heating member can be positioned as the heating member is shown in FIG. 3, or in another configuration similarly not encased in refractory material. In another example, the one or more heating members can be positioned above the height of the bottom edge of the insulation. In another example, the bottom edge of the insulation can be positioned above the height of the one or more heating members. In an embodiment in which the one or more heating members are positioned at different heights, the edge of the insulation can be in-between the heights of the heating members, or in any other configuration as described above.

The top heater can include an outer jacket, for example top heater 300 shown in FIG. 3 includes outer jacket 330. The outer jacket can include any suitable material. For example, the outer jacket can include steel or stainless steel. In another embodiment, the outer jacket includes steel, stainless steel, copper, cast iron, a refractory material, a mixture of refractory materials, or a combination thereof. The insulation 320 is disposed at least partially between the one or more heating members and the outer jacket. In FIG. 3, the bottom edge of the outer jacket 330 is shown to be approximately even with the bottom edge of the insulation and with the one or more heating members. However, as discussed with respect to the one or more heating members and the insulation above, various configurations of the outer jacket, the insulation, and the one or more heating members are encompassed as embodiments of the present invention. For example, the edge of outer jacket can extend below the edge of the insulation and the one or more heating members. In another example, the edge of the outer jacket can extend below the edge of the insulation, below the one or more heating members, or a combination thereof. In one example, the outer jacket can extend below the bottom edge of the insulation and continue across either fully or partially covering the bottom edge of the insulation. In some embodiments, the portion of the outer jacket that covers the edge of the insulation can include a material with a relatively low conductivity, such as a suitable refractory, such as aluminum oxide, silicon oxide, magnesium oxide, calcium oxide, zirconium oxide, chromium oxide, silicon carbide, graphite, or a combination thereof. In another example, the outer jacket does not extend below the bottom edge of the insulation or the height of the one or more heating members. In another embodiment, the outer jacket extends below the height of the one or more heating members, but is still above the bottom edge of the insulation. In an embodiment in which the one or more heating members are positioned at different heights, the outer jacket can extend to a height that is in-between the heights of the heating elements, or in any other configuration as described above.

In some embodiments, the top heater outer jacket can include structural members. The structural members can add strength and rigidity to the top heater. The structural members can include steel, stainless steel, copper, cast iron, a refractory material, a mixture of refractory materials, or a combination thereof. In one example, the top heater outer jacket can include one or more structural members that extend from outside of the top heater outer jacket in a direction that is away from the center of the top heater, and that extend horizontally around the circumference or perimeter of the top heater. The one or more horizontal structural members can be located, for example, at the lower edge of the outside of the top heater outer jacket, at the top edge of the outside of the top heater outer jacket, at any position in-between the bottom and top edges of the outside of the top heater outer jacket. In one example, the top heater includes three horizontal structural members, with one located at the bottom edge of the top heater outer jacket, one located at the upper edge of the top heater outer jacket, and one located in-between the lower and upper edges of the top heater outer jacket. The top heater outer jacket can include one or more structural members on the outside of the top heater outer jacket that extend for outside of the top heater outer jacket in a direction that is away from the center of the top heat vertically from the bottom of the outside of the top heater outer jacket to the top of the outside of the top heater outer jacket. In one example, the top heater outer jacket can include eight vertical structural members. The vertical structural members can be evenly spaced around the circumference or perimeter of the top heater. In another example, the top heater outer jacket includes both vertical and horizontal structural members. The top heater outer jacket can include structural members that extend across the top of the top heater outer jacket. The structural member on the top can extend from one outer edge of the top of the top heater outer jacket to another edge of the top of the top heater outer jacket. The structural members on the top can also extend partially across the top of the outer jacket. The structural members can be strips, bars, tubes, or any suitable structure for adding structural support to the top heater. The structural members can be attached to the top heater outer jacket via welding, brazing, or other suitable method. The structural members can be adapted to facilitate transportation and physical manipulation of the apparatus. For example, the structural members on the top of the outside of the top heater outer jacket can be tubes of sufficient size, strength, orientation, spacing, or a combination thereof, such that a particular fork-lift or other lifting machine could lift or move or otherwise physically manipulate the top heater. In another embodiment, the structural members described above as being located on the outside of the top heater outer jacket can alternatively or additionally be located on the inside of the top heater outer jacket. In another embodiment, the top heater can be moved using a crane or other lifting device, using chains attached to the top heater, including chains attached to structural members of the top heater or to non-structural members of the top heater. For example, four chains could be attached to the upper edge of the top heater outer jacket to form a bridle for a crane to lift and otherwise move the top heater.

Cooling

As discussed above, by controlling the temperature gradient in the apparatus, a highly controlled directional solidification can be accomplished. High degrees of control over the temperature gradient and the corresponding directional crystallization can allow a more effective directional solidification, providing a silicon of high purity. In the present invention, the directional crystallization proceeds from approximately bottom to top, thus the desired temperature gradient has a lower temperature at the bottom and a higher temperature at the top. In embodiments with a top heater, the top heater is one way to control the entry or loss of heat from the top of the directional solidification mold. Some embodiments include a conducting refractory material in the directional solidification mold to induce heat loss from the bottom of the apparatus, while some embodiments also include insulating material on the sides of the directional solidification mold to prevent heat loss therefrom and to both encourage the formation of a vertical thermal gradient and to discourage the formation of a horizontal thermal gradient. In some methods of using the present invention, fans can be blown across the bottom of the apparatus, for example across the bottom of the outer jacket, to control heat loss from the bottom of the apparatus. In some methods of using the present invention, circulation of ambient air without the use of a fan is used to cool the apparatus, including the bottom of the apparatus.

In some embodiments of the present invention, one or more heat transfer fins can be attached to the bottom of the outer jacket to facilitate air cooling of the apparatus. Fans can enhance the cooling effect of cooling fins by blowing across the bottom of the outer jacket. Any suitable number of fins can be used. The one or more fins can absorb heat from the bottom of the apparatus and allow the heat to be removed by air cooling, facilitated by the surface area of the fin. For example, the fins can be made of copper, cast iron, steel, or stainless steel.

In some embodiments of the present invention, there is included at least one liquid conduit. The at least one liquid conduit is configured to allow a cooling liquid to pass through the conduit, thereby transferring heat away from the directional solidification mold. The cooling liquid can be any suitable cooling liquid. The cooling liquid can be one liquid. The cooling liquid can be a mixture of more than one liquid. The cooling liquid can include water, ethylene glycol, diethylene glycol, propylene glycol, an oil, a mixture of oils, or a combination thereof.

In some embodiments, the at least one liquid conduit includes a tube. The tube can include any suitable material. For example, the tube can include copper, cast iron, steel, stainless steel, a refractory material, a mixture of refractory materials, or a combination thereof. The at least one liquid conduit can include a conduit through a material. The conduit can be through any suitable material. For example, the conduit can be through a material that includes copper, silicon carbide, graphite, cast iron, steel, stainless steel, a refractory material, a mixture of refractory materials, or a combination thereof. The at least one liquid conduit can be a combination of a tube and a conduit through a material. In some embodiments, the at least one liquid conduit can be located adjacent to the bottom of the apparatus. The at least one liquid conduit can be located within the bottom of the apparatus. The location of the at least one liquid conduit can include a combination of being adjacent to the bottom of the apparatus and being within the bottom of the apparatus.

The liquid conduit included in some embodiments of the present invention encompasses a variety of configurations that allow a cooling liquid to transfer heat away from the directional solidification mold. A pump can be used to move the cooling liquid. A cooling system can be used to remove heat from the cooling liquid. For example, one or more tubes, including pipes, can be used. The one more tubes can be any suitable shape, including round, square, or flat. The tubes can be coiled. The tubes can be adjacent to the outside of the outer jacket. In preferred embodiments, the tubes can be adjacent to the bottom of the outside of the outer jacket. The tubes can contact the outer jacket such that sufficient surface area contact occurs to allow efficient transfer of heat from the apparatus to the cooling liquid. The tubes can contact the outer jacket in any suitable fashion, including along an edge of a tube. The tubes can be welded, brazed, soldered, or attached by any suitable method to the outside of the outer jacket. The tubes can be flattened to the outside of the outer jacket to enhance the efficiency of heat transfer. In some embodiments, the at least one liquid conduit is one or more conduits running through the bottom of the bottom mold. A conduit running through the bottom of the bottom mold can be a tube encased in a refractory that is included in the directional solidification mold. A tube can enter one part of the outer jacket, run through a refractory material or conductive material or a combination thereof at the bottom of the directional solidification mold, and exit another part of the outer jacket. A tube encased in the bottom refractory or bottom conductive material of the directional solidification mold can be coiled, or arranged in any suitable shape, including moving back and forth one or more times before exiting the bottom of the apparatus.

In another embodiment, the at least one liquid conduit includes a tube encased in a refractory material, a heat-conductive material, or a combination thereof, wherein the material is a block of material large enough for the apparatus to be placed on. The conduit can be through any suitable material. For example, the conduit can be through a material that includes copper, silicon carbide, graphite, cast iron, steel, stainless steel, a refractory material, a mixture of refractory materials, or a combination thereof. The cooling liquid can remove heat from the refractory material on which the bottom mold sits, thereby removing heat from the bottom of the apparatus.

General

Figure 4:
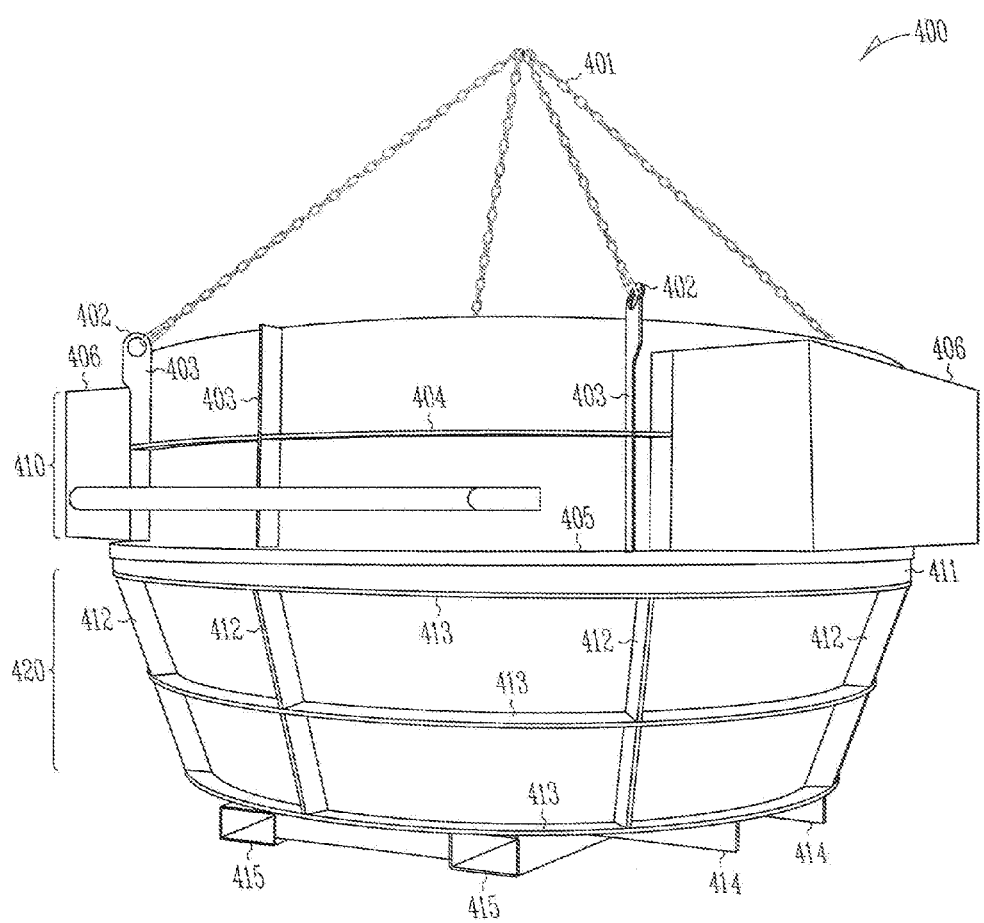
FIG. 4 illustrates a 3D projection of an apparatus for directional solidification of silicon, including a heater positioned on top of a mold, as constructed in accordance with at least one embodiment.

FIG. 4 illustrates a specific embodiment of an apparatus 400 for directional solidification of silicon, including a top heater part positioned on top of a bottom mold 420. The top heater includes chains 401 which are connected to the top heater 410 via holes 402 in vertical structural members 403. The chains 401 form a bridle, which can allow the top heater to be moved by the use of a crane. The apparatus can also be moved, for example, by placing the bottom half of the apparatus on a scissor lift while leaving the top heater over the bottom half. The apparatus can be moved in any suitable fashion. The vertical structural members 403 extend vertically from the bottom edge of the outer jacket of the top heater 410 to the top edge of the stainless steel outer jacket of the top heater 410. The vertical structural members are located on the outside of the top heater outer jacket and extend from the jacket parallel to a direction that is away from the center of the top heater. The top heater also includes a horizontal structural member 404, which is located on the outside of the top heater outer jacket and extends from the jacket in a direction that is parallel to a direction that is away from the center of the top heater. The top heater also includes a lip 405 that is part of the outer jacket of the top heater. The lip protrudes away from the outer jacket of the top heater. The lip can extend inward toward the center axis of the top heater such that it covers insulation of the top heater to any suitable extent. Alternatively, the lip can extend inward only enough to cover the bottom edge of the outer jacket of the top heater. Screen boxes 406 enclose ends of the heating members that protrude from the outer jacket of the top heater, protecting users from the heat and electricity that can be present in and near the ends of these members.

In the specific embodiment depicted in FIG. 4, insulation 411 from the bottom mold 420 is between the top heater 410 and the bottom mold 420. At least part of the one or more insulating layers of the bottom mold extends above the height of the outer jacket of the bottom mold. The bottom mold includes vertical structural members 412. The vertical structural members 412 are on the outer surface of the outer jacket of the bottom mold, extending away from the outer jacket parallel to a direction that is away from the center of the bottom mold. The vertical structural members 412 extend vertically from the bottom edge of the outer jacket to the top edge of the outer jacket. The bottom mold also includes horizontal structural members 413. The horizontal structural members 413 are on the outer surface of the outer jacket of the bottom mold, extending away from the outer jacket parallel to a direction that is away from the center of the bottom mold. The horizontal structural members 413 extend horizontally around the circumference of the bottom mold. The bottom mold also includes bottom structural members 414 and 415. The bottom structural members 414 and 415 extend away from the outer jacket parallel to a direction that is away from the center of the bottom mold. The bottom structural members extend across the bottom of the bottom mold. Some of the bottom structural members 415 are shaped such that they allow a forklift or other machine to lift or otherwise physically manipulate the apparatus.

Figure 5:
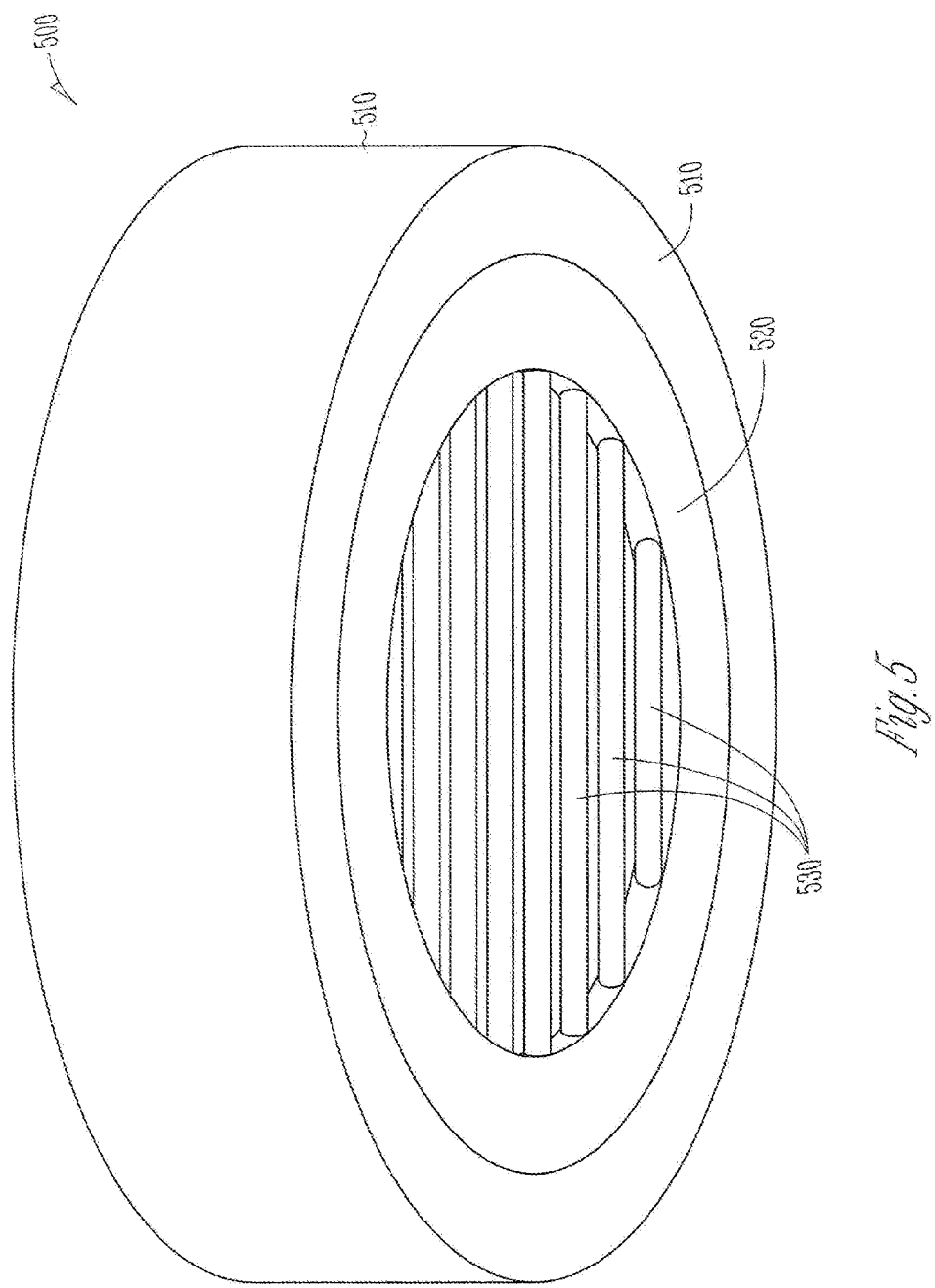
FIG. 5 illustrates an isometric view of a heater of an apparatus for directional solidification of silicon, as constructed in accordance with at least one embodiment.

FIG. 5 illustrates a view towards the bottom of a top heater 510, part of an embodiment of an apparatus 500 for directional solidification of silicon. In this specific embodiment, the outer jacket extends over part of the insulating layer 520 at the bottom edge of the top heater. The heating members 530 are at equal heights, and the bottom edge of the outer jacket of the top heater 510 and the insulation 520 is below the height of the heating elements.

Figure 6:
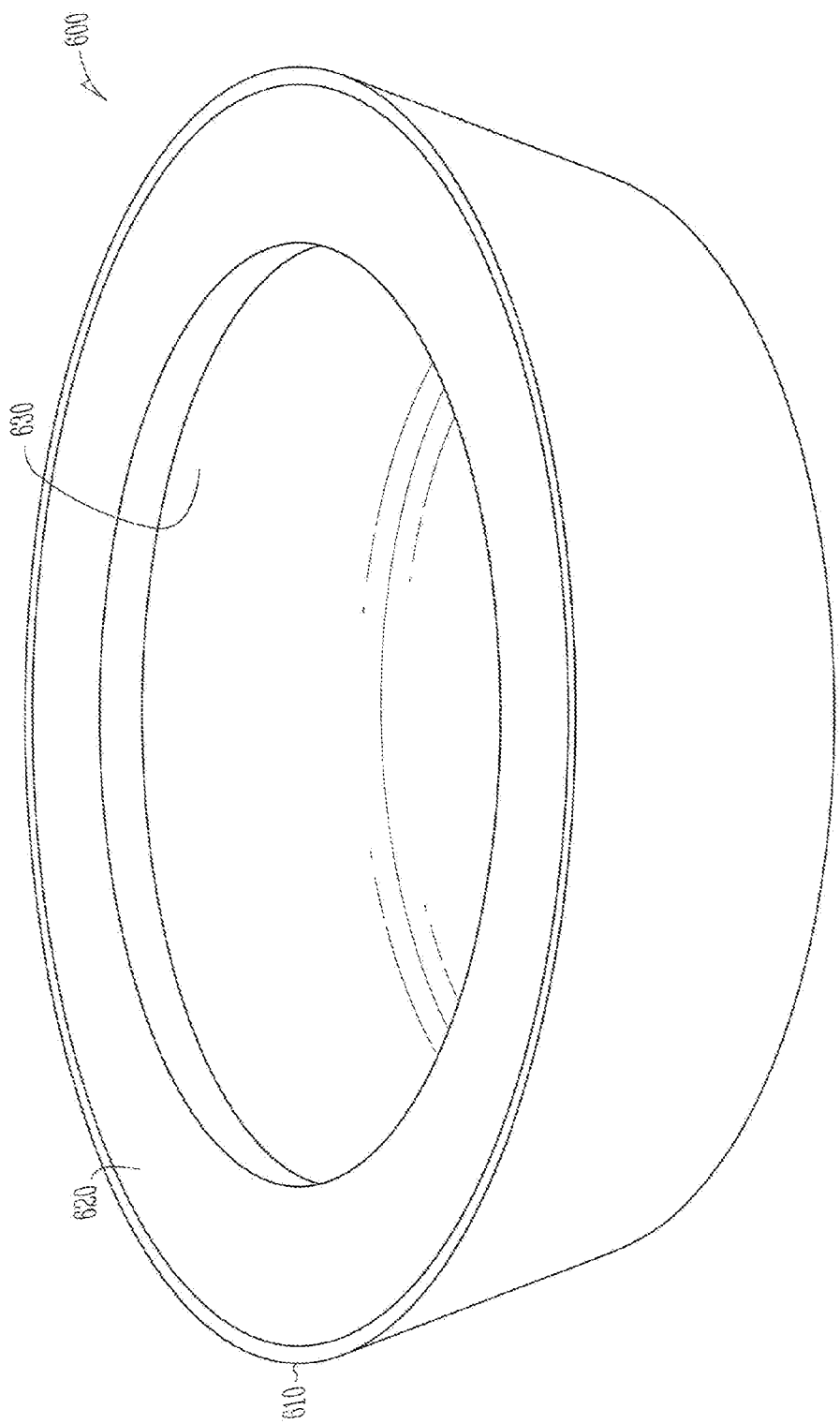
FIG. 6 illustrates an isometric view of a mold of an apparatus for directional solidification of silicon, as constructed in accordance with at least one embodiment.

FIG. 6 illustrates a view towards the inside of the directional solidification mold of an embodiment of an apparatus 600 for the directional solidification of silicon. In this specific embodiment, the edge of the outer jacket 610 does not extend over the edge of the insulating layer 620. Rather, the insulating layer 620 extends over the top edge of the directional solidification mold 630. The top edge of the directional solidification mold is below the height of the top edge of the insulation 620 and the outer jacket 610. The overall three-dimensional shape of the embodiment is similar to that of a large thick-walled bowl.

FIG. 7 illustrates a silicon ingot 700 generated by embodiment of an apparatus and method of the present invention. The ingot is shown with the bottom of the ingot 701 facing upwards, and the top of the ingot 702 facing downwards. After being generated by directional crystallization in an embodiment of the present invention, ingot 700 has the greatest amount of impurities in the last-to-freeze portion, at the top of the ingot 702. Thus, in some embodiments, the top of the ingot 702 is removed using, for example, a band saw, to increase the overall purity of the ingot 700.

Method of Using

The present invention provides a method of purifying silicon using the apparatus described above, where the apparatus can be any embodiment of the apparatus. The method of purifying silicon can be a method of making one or more silicon ingots for cutting into one or more solar wafers. The method includes providing or receiving a first silicon. The first silicon can include silicon of any suitable grade of purity. The method can include at least partially melting the first silicon. The method can include fully melting the first silicon. At least partially melting the first silicon can include completely melting the first silicon, almost completely melting the first silicon (over about either 99%, 95%, 90%, 85%, or 80% melted by weight), or partially melting the first silicon (less than about 80% or less melted by weight). Melting the first silicon provides a first molten silicon. The method includes providing or receiving a directional solidification apparatus. The directional solidification apparatus can substantially similar to that described above. The method includes directionally solidifying the first silicon, to provide a first molten silicon. In the directional solidification, the silicon solidifies approximately starting at the bottom of the directional solidification mold, and approximately ending at the top of the directional solidification mold. The directional solidification provides a second silicon. The last-to-freeze portion of the second silicon includes a greater concentration of impurities than the first silicon. The portions of the second silicon other than the last-to-freeze portion include a lower concentration of impurities than the first silicon.

The second silicon can be a silicon ingot. The silicon ingot can suitable for cutting into solar wafers, for the manufacture of solar cells. The silicon ingot can be cut into solar wafer using, for example, a band saw, a wire saw, or any suitable cutting device.

In some embodiments, the method is performed in a vacuum, in an inert atmosphere, or in ambient air. To perform the method in a vacuum or in an inert atmosphere, the apparatus can be placed in a chamber that is capable of being made a less than atmospheric pressure or of being filling with an atmosphere with a greater concentration of inert gasses than ambient air. In some embodiments, argon can be pumped into the apparatus or into a chamber holding the apparatus, to displace oxygen from the apparatus.

In some embodiments, the method includes positioning the top heater described above over the directional solidification mold. The bottom mold, including the directional solidification mold, can be preheated before molten silicon is added. The top heater can be used to preheat the bottom mold. Preheating the bottom mold can help to prevent excessive quick solidification of silicon on the walls of the mold. The top heater can be used to melt the first silicon. The top heater can be used to transfer heat to the silicon, after it is melted. The top heater can transfer heat to the silicon after it is melted when the silicon is melted in the directional solidification mold. The top heater can be used to control the heat of the top of the silicon. The top heater can be used as an insulator, to control the amount of heat loss at the top of the bottom mold. The first silicon can be melted outside the apparatus, such as in a furnace, and then added to the apparatus. In some embodiments, silicon that is melted outside the apparatus can be further heated to a desired temperature using the top heater after being added to the apparatus.

In embodiments including a top heater including an induction heater, the silicon will preferably be melted prior to being added to the bottom mold. Alternatively, the top heater will include heating elements as well as induction heaters. Induction heating can be more effective with molten silicon. Induction can cause mixing of the molten silicon. In some embodiments, the power can adjusted sufficiently to optimize the amount of mixing, as too much mixing can improve segregation of impurities but can also create undesirable porosity in the final silicon ingot.

The directional solidification can include the removal of heat from the bottom of the directional solidification apparatus. The removal of heat can occur in any suitable fashion. For example, the removal of heat can include blowing fans across the bottom of the directional solidification apparatus. The removal of heat can include allowing ambient air to cool the bottom of the apparatus, without the use of fans. The removal of heat can include running a cooling liquid through tubes adjacent to the bottom of the apparatus, though tubes that run through the bottom of the apparatus, through tubes that run through a material on which the apparatus sits, or a combination thereof. Removal of heat from the bottom of the apparatus allows a thermal gradient to be established in the apparatus that causes directional solidification of the molten silicon therein approximately from the bottom of the directional solidification mold to the top of the mold.

Removal of heat from the bottom of the apparatus can be performed for the entire duration of the directional solidification. Multiple cooling methods can be used. For example, the bottom of the apparatus can be liquid cooled and cooled with fans. Fan cooling can occur for part of the directional solidification, and liquid cooling for another, with any suitable amount of overlap or lack thereof between the two cooling methods. Cooling with liquid can occur for part of the directional solidification, and ambient air cooling alone for another part, with any suitable amount of overlap or lack thereof between the two cooling methods. Cooling by setting the apparatus on a cooled block of material can also occur for any suitable duration of the directional solidification, including in any suitable combination with other cooling methods with any suitable amount of overlap. Cooling of the bottom can be performed while heat is being added to the top; for example, while heat is added to the top to increase the temperature of the top, to maintain the temperature of the top, or to allow a particular rate of cooling of the top. All suitable configurations and methods of heating the top of the apparatus, cooling the bottom, and combinations thereof, with any suitable amount of temporal overlap or lack thereof, are encompassed as embodiments of the present invention.

The directional solidification can include using the top heater to heat the silicon to at least about 1450° C., and slowly cooling the temperature of the top of the silicon from approximately 1450 to 1410° C. over approximately 10 to 16 hours. The directional solidification can include using the top heater to heat the silicon to at least about 1450° C., and holding the temperature of the top of the silicon approximately constant at between approximately 1425 and 1460° C. for approximately 14 hours. The directional solidification can include turning off the top heater, allowing the silicon to cool for approximately 4-12 hours, and then removing the top heater from the directional solidification mold.

In one embodiment, the directional solidification includes using the top heater to heat the silicon to at least about 1450° C., and holding the temperature of the top of the silicon approximately constant at between approximately 1425 and 1460° C. for approximately 14 hours. The embodiment includes turning off the top heater, allowing the silicon to cool for approximately 4-12 hours, and then removing the top heater from the directional solidification mold.

In another embodiment, the directional solidification includes using the top heater to heat the silicon to at least about 1450° C., and slowly cooling the temperature of the top of the silicon from approximately 1450 to 1410° C. over approximately 10 to 16 hours. The embodiment includes turning off the top heater, allowing the silicon to cool for approximately 4-12 hours, and then removing the top heater from the directional solidification mold.

The method can include removing the second silicon from the directional solidification apparatus. The silicon can be removed by any suitable method. For example, the silicon can be removed by inverting the apparatus and allowing the second silicon to drop out of the directional solidification mold. In another example, the directional solidification apparatus is parted down the middle to form two halves, allowing the second silicon to be easily removed from the mold.

The method can include removing any suitable section from the directionally solidified second silicon. Preferably, the removal of the suitable section leads to an increase in the overall purity of the silicon ingot. For example, the method can include removing from the directionally solidified second silicon at least part of the last-to-freeze section. Preferably, the last-to-freeze section of the directionally solidified silicon is the top of the ingot, as it is oriented during the bottom-totop directional solidification. The greatest concentration of impurities generally occurs in the last-to-freeze section of the solidified silicon. Removing the last-to-freeze section thus can remove impurities from the solidified silicon, resulting in a trimmed-second silicon with a lower concentration of impurities than the first silicon. The removal of a section of the silicon can include cutting the solid silicon with a band saw. The removal of a section of the silicon can include shot blasting or etching. Shot blasting or etching can also be used generally to clean or remove any outer surface of the second silicon, not just the last-to-freeze portion.

EMBODIMENTS

The present invention provides for the following exemplary embodiments:

Embodiment 1

An apparatus for directional solidification of silicon, comprising:
 a directional solidification mold including at least one refractory material;
 an outer jacket; and
 an insulating layer disposed at least partially between the directional solidification mold and the outer jacket.

Embodiment 2

The apparatus of embodiment 1, wherein the directional solidification mold, the outer jacket and the insulating layer are configured to be used more than twice for the directional solidification of silicon.

Embodiment 3

The apparatus of any one of embodiments 1-2, wherein the directional solidification mold includes a capacity to receive at least about 1.4 metric tonnes of silicon.

Embodiment 4

The apparatus of any one of embodiments 1-3, wherein the at least one refractory material comprises aluminum oxide, silicon oxide, magnesium oxide, calcium oxide, zirconium oxide, chromium oxide, silicon carbide, graphite, or a combination thereof.

Embodiment 5

The apparatus of any one of embodiments 1-4, wherein one or more side walls of the directional solidification mold include a different thickness, material composition or amount of material relative to a bottom of the directional solidification mold.

Embodiment 6

The apparatus of any one of embodiments 1-5, wherein one or more side walls of the directional solidification mold include a hot face refractory, and wherein a bottom of the directional solidification mold includes a conducting refractory.

Embodiment 7

The apparatus of any one of embodiments 1-6, wherein one or more side walls of the directional solidification mold include aluminum oxide, and wherein a bottom of the directional solidification mold includes silicon carbide, graphite, or a combination thereof.

Embodiment 8

The apparatus of any one of embodiments 1-7, wherein the insulating layer includes an insulating brick, a refractory material, an insulating board, a ceramic paper, a high temperature wool, or a combination thereof.

Embodiment 9

The apparatus of any one of embodiments 1-8, wherein one or more side walls of the insulating layer include a different thickness, composition of material or amount of material relative to a bottom of the insulating layer.

Embodiment 10

The apparatus of any one of embodiments 1-9, wherein the insulating layer is disposed at least partially between one or more side walls of the directional solidification mold and one or more side walls of the outer jacket, and wherein the insulating layer is not disposed between a bottom of the directional solidification mold and a bottom of the outer jacket.

Embodiment 11

The apparatus of any one of embodiments 1-10, wherein the outer jacket includes steel, stainless steel, copper, cast iron, a refractory material, a mixture of refractory materials, or a combination thereof.

Embodiment 12

The apparatus of any one of embodiments 1-11, further comprising a draft sufficient to allow the removal directionally solidified silicon from the mold.

Embodiment 13

The apparatus of any one of embodiments 1-12, wherein the outer jacket further comprises one or more structural members, the structural members including steel, stainless steel, copper, cast iron, a refractory material, a mixture of refractory materials, or a combination thereof.

Embodiment 14

The apparatus of any one of embodiments 1-13, further comprising at least one liquid conduit, the liquid conduit sized and shaped to allow a cooling liquid to pass therethrough and transfer heat away from the directional solidification mold.

Embodiment 15

The apparatus of embodiment 14, further comprising the cooling liquid selected from a group consisting of water, ethylene glycol, diethylene glycol, propylene glycol, an oil, a mixture of oils, or a combination thereof.

Embodiment 16

The apparatus of any one of embodiments 14-15, wherein the at least one liquid conduit includes copper, cast iron, steel, stainless steel, a refractory material, a mixture of refractory materials, or a combination thereof.

Embodiment 17

The apparatus of any one of embodiments 14-16, wherein the at least one liquid conduit is located adjacent to or within a bottom portion of the directional solidification mold, the outer jacket or the insulating layer.

Embodiment 18

The apparatus of any one of embodiments 1-17, wherein the directional solidification mold comprises a top layer including at least one slip-plane refractory material, the top layer configured to protect the remainder of the directional solidification mold from damage when directionally solidified silicon is removed therefrom.

Embodiment 19

The apparatus of embodiment 18, wherein the top layer includes a substantially consistent thickness and composition throughout.

Embodiment 20

The apparatus of any one of embodiments 18-19, wherein the at least one slip-plane refractory includes fused silicon dioxide, silicon dioxide, aluminum oxide, silicon nitride, graphite, or a combination thereof.

Embodiment 21

The apparatus of any one of embodiments 18-20, where the top layer is configured to be replaced or repaired between a first directional solidification of silicon and a second directional solidification of silicon.

Embodiment 22

The apparatus of any one of embodiments 1-21, further comprising a top heater including one or more heating members, the one or more heating members including a heating element or an induction heater.

Embodiment 23

The apparatus of embodiment 22, wherein the heating elements include silicon carbide, molybdenum disilicide, graphite, or a combination thereof.

Embodiment 24

The apparatus of any one of embodiments 22-23, further comprising an electrical system configured to supply power to the one or more heating members, the electrical system coupled to the heating members such that if any one heating element fails, any remaining heating elements continue to receive electricity and to produce heat.

Embodiment 25

The apparatus of any one of embodiments 22-24, wherein the top heater further comprises insulation, the insulation including an insulating brick, a refractory, a mixture of refractories, an insulating board, a ceramic paper, a high temperature wool, or a mixture thereof.

Embodiment 26

The apparatus of any one of embodiments 22-25, wherein the top heater further comprises an outer jacket, wherein the insulation is disposed at least partially between the one or more heating elements and the top heater outer jacket.

Embodiment 27

The apparatus of embodiment 26, wherein the top heater outer jacket further comprises one or more structural members, the structural members including steel, stainless steel, copper, cast iron, a refractory material, a mixture of refractory materials, or a combination thereof.

Embodiment 28

The apparatus of any one of embodiments 26-27, wherein the top heater outer jacket includes stainless steel.

Embodiment 29

The apparatus of any one of embodiments 1-28, configured such that a first half is separable from a second half, along a vertical seam, sufficient to remove directionally solidified silicon, and
wherein the first half and the second half can be joined to form the apparatus, and the apparatus can be reused.

Embodiment 30

A method of purifying silicon, comprising:
providing or receiving a first silicon;
at least partially melting the first silicon, to provide a first molten silicon; and
directionally solidifying the first molten silicon in the directional solidification apparatus of any one of embodiments 1-29, to provide a second silicon.

Embodiment 31

A method of purifying silicon, comprising:
providing or receiving a first silicon;
providing or receiving a directional solidification apparatus, wherein the apparatus comprises:
a directional solidification mold including at least one refractory material;
an outer jacket; and
an insulating layer disposed at least partially between the directional solidification mold and the outer jacket;
at least partially melting the first silicon to provide a first molten silicon; and
directionally solidifying the first molten silicon in the directional solidification mold to provide a second silicon.

Embodiment 32

The method of embodiment 31, wherein the method of purifying silicon can be a method of making one or more silicon ingots for cutting into one or more solar wafers.

Embodiment 33

The method of any one of embodiments 31-32, further comprising positioning a heater over the directional solidification mold, including positioning one or more heating members selected from a heating element and an induction heater over the directional solidification mold.

Embodiment 34

The method of any one of embodiments 31-33, further comprising adding the first molten silicon to the directional solidification apparatus,
wherein melting the first silicon includes melting the first silicon outside the directional solidification apparatus.

Embodiment 35

The method of any one of embodiments 31-34, wherein melting the first silicon including melting the first silicon inside the directional solidification apparatus prior to the directional solidification.

Embodiment 36

The method of any one of embodiments 31-35, wherein directionally solidifying the first molten silicon comprises removing heat from a bottom of the directional solidification apparatus.

Embodiment 37

The method of any one of embodiments 31-36, further comprising removing the second silicon from the directional solidification apparatus.

Embodiment 38

The method of any one of embodiments 33-37, wherein the heating element include silicon carbide, molybdenum disilicide, graphite, or a combination thereof.

Embodiment 39

The method of any one of embodiments 33-38, wherein directionally solidifying the first molten silicon comprises
using the top heater to heat the silicon to at least about 1450° C.; and
slowly cooling the temperature of a top portion of the silicon from approximately 1450° C. to 1410° C. over approximately 10 to 16 hours.

Embodiment 40

The method of any one of embodiments 33-39, wherein directionally solidifying the first molten silicon comprises:
using the top heater to heat the silicon to at least about 1450° C.; and,
holding the temperature of the top of the silicon approximately constant at between approximately 1425° C. and 1460° C. for approximately 14 hours.

Embodiment 41

The method of any one of embodiments 33-40, wherein directionally solidifying the first molten silicon comprises
turning off the top heater;
allowing the silicon to cool for approximately 4-12 hours; and removing the top heater from the directional solidification mold.

Embodiment 42

The method of any one of embodiments 36-41, wherein removing heat from the bottom of the directional solidification apparatus includes cooling the bottom of the apparatus with one or more fans.

Embodiment 43

The method of any one of embodiments 36-42, wherein removing heat from a bottom of the directional solidification apparatus includes cooling the bottom of the apparatus with a cooling liquid.

Embodiment 44

The method of any one of embodiments 37-43, further comprising removing from the directionally solidified second silicon at least part of the last-to-freeze section.

Embodiment 45

An apparatus for directional solidification of silicon, comprising:
a directional solidification mold including a refractory material,
wherein one or more side walls of the directional solidification mold include aluminum oxide;
wherein a bottom of the directional solidification mold includes silicon carbide, graphite, or a combination thereof;
a top layer, including a slip-plane refractory, the top layer configured to protect the remainder of the directional solidification mold from damage when directionally solidified silicon is removed from the mold;
an outer jacket, including steel;
an insulating layer, including insulating brick, a refractory material, a mixture of refractory materials, insulating board, ceramic paper, high temperature wool, or a mixture thereof, the insulating layer disposed at least partially between one or more side walls of the directional solidification mold and one or more side walls of the outer jacket;
a top heater, comprising:
one or more heating members, each of the heating members including a heating element or an induction heater;
wherein the heating element includes silicon carbide, molybdenum disilicide, graphite, or a combination thereof;
insulation, including insulating brick, a refractory, a mixture of refractories, insulating board, ceramic paper, high temperature wool, or a combination thereof;
an outer jacket, including stainless steel;
wherein the insulation is disposed at least partially between the one or more heating members and the top heater outer jacket;

wherein the directional solidification mold, the outer jacket and the insulating layer are configured to be used more than twice for the directional solidification of silicon.

EXAMPLES

Example 1

Silicon carbide resistance elements were used in a top heater insulated with high temperature wool insulation and a steel shell. Molten silicon (1.4 tonnes) was poured into a refractory-lined preheated bottom section of the apparatus. The apparatus had aluminum oxide refractory walls including a draft to allow the silicon to be dumped out after cooling. The walls of the refractory were coated with a thin slip-plane of aluminum oxide refractory and then a second layer of $Si_3N_4$ powder. The bottom of the directional solidification mold was made from silicon carbide refractory and the outside of the steel shell was cooled with fans blowing air on the bottom of the outer shell. The heaters were set at 1450° C. for 14 hrs and then the elements were turned off. Six hours later the top heater section was removed and the silicon was allowed to cool to room temperature. The mold was flipped over. The 1.4 tonne ingot was cut in half and the top 25% of the ingot was cut off to remove impurities. The grains were about 1-2 cm in width and 3-10 cm in height, forming columns in the vertical direction similar to a standard ingot from the Bridgeman process.

Example 2

Silicon carbide resistance elements were used in a top heater insulated with high temperature wool insulation and a steel shell. Molten silicon (0.7 tonnes) was poured into a refractory-lined preheated bottom section of the apparatus. The apparatus had aluminum oxide refractory walls including a middle parting line to remove the silicon ingot. The walls of the refractory were coated with a thin slip-plane of $SiO_2$ refractory. The bottom of the directional solidification mold was made from graphite and the outside of the steel shell was cooled with fans blowing air on the bottom of the outer shell. The heaters were set at 1450° C. for 12 hours and then the elements were turned off. Six hours later the top heater section was removed and the silicon was allowed to cool to room temperature. The mold was opened at the parting line. The 0.7 tonne ingot was cut in half and the top 15% of the ingot was cut off to remove impurities. The grains were about 1 cm in width and 3-10 cm in height, forming columns in the vertical direction similar to a standard ingot from the Bridgeman process.

All publications, patents, and patent applications are incorporated herein by reference. While in the foregoing specification this disclosed subject matter has been described in relation to certain preferred embodiments thereof, and many details have been set forth for purposes of illustration, it will be apparent to those skilled in the art that the disclosed subject matter is susceptible to additional embodiments and that certain of the details described herein can be varied considerably without departing from the basic principles of the disclosed subject matter.

What is claimed is:

1. An apparatus for directional solidification of silicon, comprising:
a directional solidification mold including at least one refractory material;
an outer jacket; and an insulating layer disposed at least partially between the directional solidification mold and the outer jacket, wherein the insulating layer is in contact with at least a portion of the directional solidification mold, a portion of an inner side surface of the outer jacket, and at least a portion of an inner bottom surface of the outer jacket, and wherein the insulating layer is not disposed between the bottom of the directional solidification mold and the inner bottom surface of the outer jacket, and the directional solidification mold is in contact with at least a portion of the inner bottom surface of the outer jacket.

2. The apparatus of claim 1, wherein the directional solidification mold, the outer jacket and the insulating layer are configured to be used more than twice for the directional solidification of silicon.

3. The apparatus of claim 1, wherein one or more side walls of the directional solidification mold include a different thickness, material composition or amount of material relative to a bottom of the directional solidification mold.

4. The apparatus of claim 1, wherein one or more side walls of the directional solidification mold include a hot face refractory, and wherein a bottom of the directional solidification mold includes a conducting refractory.

5. The apparatus of claim 1, wherein one or more side walls of the directional solidification mold include aluminum oxide, and wherein a bottom of the directional solidification mold includes silicon carbide, graphite, or a combination thereof.

6. The apparatus of claim 1, wherein one or more side walls of the insulating layer include a different thickness, composition of material or amount of material relative to a bottom of the insulating layer.

7. The apparatus of claim 6, wherein the insulating layer is disposed at least partially between one or more side walls of the directional solidification mold and one or more side walls of the outer jacket.

8. The apparatus of claim 1, wherein the outer jacket includes steel, stainless steel, copper, cast iron, a refractory material, a mixture of refractory materials, or a combination thereof.

9. The apparatus of claim 1, further comprising at least one liquid conduit, the liquid conduit sized and shaped to allow a cooling liquid to pass therethrough and transfer heat away from the directional solidification mold.

10. The apparatus of claim 9, wherein the at least one liquid conduit is located adjacent to or within a bottom portion of the directional solidification mold, the outer jacket, or the insulating layer.

11. The apparatus of claim 1, wherein the directional solidification mold comprises a top layer including at least one slip-plane refractory material, the top layer configured to protect the remainder of the directional solidification mold from damage when directionally solidified silicon is removed therefrom.

12. The apparatus of claim 1, further comprising a top heater including one or more heating members, the one or more heating members including a heating element or an induction heater.

13. The apparatus of claim 12, wherein the top heater further comprises insulation, the insulation including an insulating brick, a refractory, a mixture of refractories, an insulating board, a ceramic paper, a high temperature wool, or a mixture thereof.

14. The apparatus of claim 13, wherein the top heater further comprises an outer jacket, wherein the insulation is disposed at least partially between the one or more heating elements and the top heater outer jacket.

15. The apparatus of claim 14, wherein the top heater outer jacket includes stainless steel.

16. An apparatus for directional solidification of silicon, comprising:
- a directional solidification mold including a refractory material,
    - wherein one or more side walls of the directional solidification mold include aluminum oxide;
    - wherein a bottom of the directional solidification mold includes silicon carbide, graphite, or a combination thereof;
    - a top layer, including a slip-plane refractory, the top layer configured to protect the remainder of the directional solidification mold from damage when directionally solidified silicon is removed from the mold;
- an outer jacket, including steel;
- an insulating layer, including insulating brick, a refractory material, a mixture of refractory materials, insulating board, ceramic paper, high temperature wool, or a mixture thereof, the insulating layer disposed at least partially between one or more side walls of the directional solidification mold and one or more side walls of the outer jacket;
- a top heater, comprising:
    - one or more heating members, each of the heating members including a heating element or an induction heater;
        - wherein the heating element includes silicon carbide, molybdenum disilicide, graphite, or a combination thereof;
        - insulation, including insulating brick, a refractory, a mixture of refractories, insulating board, ceramic paper, high temperature wool, or a combination thereof;
        - an outer jacket, including stainless steel;
        - wherein the insulation is disposed at least partially between the one
    - or more heating members and the top heater outer jacket;
- wherein the directional solidification mold, the outer jacket and the insulating layer are configured to be used more than twice for the directional solidification of silicon; and
- wherein the insulating layer is not disposed between the bottom of the directional solidification mold and an inner bottom surface of the outer jacket, and the directional solidification mold is in contact with at least a portion of the inner bottom surface of the outer jacket.

\* \* \* \* \*